United States Patent
Cheng et al.

(10) Patent No.: US 10,410,872 B2
(45) Date of Patent: Sep. 10, 2019

(54) BORANE MEDIATED DEHYDROGENATION PROCESS FROM SILANE AND ALKYLSILANE SPECIES FOR SPACER AND HARDMASK APPLICATION

(71) Applicant: Applied Materials, Inc., Santa Clara, CA (US)

(72) Inventors: Rui Cheng, San Jose, CA (US); Ziqing Duan, Sunnyvale, CA (US); Milind Gadre, Santa Clara, CA (US); Praket P. Jha, San Jose, CA (US); Abhijit Basu Mallick, Fremont, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/695,269

(22) Filed: Sep. 5, 2017

(65) Prior Publication Data

US 2018/0076042 A1    Mar. 15, 2018

Related U.S. Application Data

(60) Provisional application No. 62/393,915, filed on Sep. 13, 2016.

(51) Int. Cl.
*H01L 21/285* (2006.01)
*C23C 16/30* (2006.01)
(Continued)

(52) U.S. Cl.
CPC ...... *H01L 21/28525* (2013.01); *C23C 16/045* (2013.01); *C23C 16/24* (2013.01);
(Continued)

(58) Field of Classification Search
CPC ......... H01L 21/28525; H01L 21/02579; H01L 21/02494; H01L 21/02488; H01L 21/0337;
(Continued)

(56) References Cited

U.S. PATENT DOCUMENTS 5,389,570 A      2/1995  Shiozawa
5,700,712 A  *  12/1997  Schwalke ........... H01L 21/2255
                                                            257/E21.149
(Continued)

FOREIGN PATENT DOCUMENTS

JP        4976977         7/2012
KR     10-2012-0057818    6/2012

OTHER PUBLICATIONS

International Search Report and Written Opinion for International Application No. PCT/US2017/050107 dated Dec. 15, 2017.

*Primary Examiner* — Su C Kim
(74) *Attorney, Agent, or Firm* — Patterson + Sheridan LLP

(57) ABSTRACT

Implementations described herein generally relate to the fabrication of integrated circuits and particularly to the deposition of a boron-doped amorphous silicon layers on a semiconductor substrate. In one implementation, a method of forming a boron-doped amorphous silicon layer on a substrate is provided. The method comprises depositing a predetermined thickness of a sacrificial dielectric layer over a substrate, forming patterned features on the substrate by removing portions of the sacrificial dielectric layer to expose an upper surface of the substrate, depositing conformally a predetermined thickness of a boron-doped amorphous silicon layer on the patterned features and the exposed upper surface of the substrate and selectively removing the boron-doped amorphous silicon layer from an upper surface of the patterned features and the upper surface of the substrate
(Continued)

using an anisotropic etching process to provide the patterned features filled within sidewall spacers formed from the boron-doped amorphous silicon layer.

16 Claims, 6 Drawing Sheets

(51) Int. Cl.
| | | |
|---|---|---|
| *H01L 21/02* | (2006.01) | |
| *H01L 21/3105* | (2006.01) | |
| *H01L 21/3205* | (2006.01) | |
| *C23C 16/04* | (2006.01) | |
| *C23C 16/24* | (2006.01) | |
| *H01L 21/033* | (2006.01) | |

(52) U.S. Cl.
CPC .......... *C23C 16/30* (2013.01); *H01L 21/0262* (2013.01); *H01L 21/02381* (2013.01); *H01L 21/02389* (2013.01); *H01L 21/02488* (2013.01); *H01L 21/02494* (2013.01); *H01L 21/02532* (2013.01); *H01L 21/02579* (2013.01); *H01L 21/0337* (2013.01); *H01L 21/3105* (2013.01); *H01L 21/32055* (2013.01); *H01L 21/02592* (2013.01); *H01L 21/02639* (2013.01); *H01L 21/02642* (2013.01)

(58) Field of Classification Search
CPC ......... H01L 21/32055; H01L 21/02532; H01L 21/0262; H01L 21/02381; H01L 21/02389; H01L 21/3105; H01L 21/02639; H01L 21/02592; H01L 21/02642; C23C 16/24; C23C 16/045; C23C 16/30

See application file for complete search history.

(56) References Cited

U.S. PATENT DOCUMENTS

| | | | |
|---|---|---|---|
| 7,576,441 | B2 | 8/2009 | Yin et al. |
| 7,732,338 | B2 | 6/2010 | Narita |
| 8,846,525 | B2 | 9/2014 | Rangarajan et al. |
| 8,927,355 | B2 | 1/2015 | Lee et al. |
| 8,993,454 | B2 | 3/2015 | Seamons et al. |
| 2001/0035706 | A1* | 11/2001 | Raina .................... H01J 1/3044 313/309 |
| 2003/0213994 | A1* | 11/2003 | Hayashi ................. H01L 21/84 257/347 |
| 2009/0104786 | A1* | 4/2009 | Narita ................ H01L 21/0337 438/763 |
| 2011/0133313 | A1 | 6/2011 | Rangarajan et al. |
| 2011/0244142 | A1 | 10/2011 | Cheng et al. |
| 2012/0202315 | A1 | 8/2012 | Whitesell, III et al. |
| 2015/0200269 | A1* | 7/2015 | Yin .................. H01L 29/66583 438/294 |
| 2015/0235897 | A1 | 8/2015 | Fu et al. |
| 2015/0279676 | A1 | 10/2015 | Kim et al. |
| 2017/0103893 | A1 | 4/2017 | Kulshreshtha et al. |

* cited by examiner

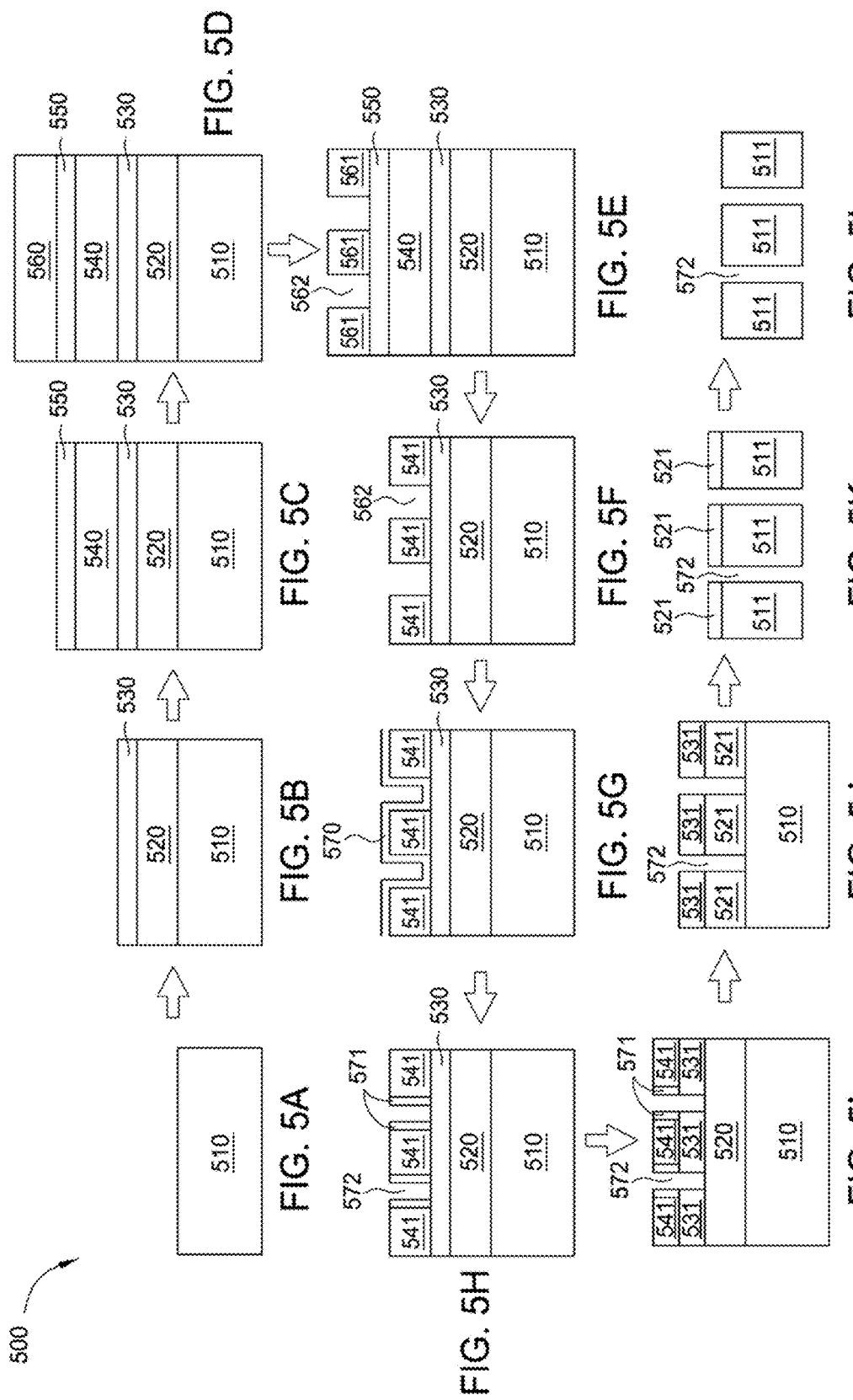

BORANE MEDIATED DEHYDROGENATION PROCESS FROM SILANE AND ALKYLSILANE SPECIES FOR SPACER AND HARDMASK APPLICATION

CROSS-REFERENCE TO RELATED APPLICATIONS

This application claims benefit of U.S. Provisional Patent Application Ser. No. 62/393,915, filed Sep. 13, 2016, which is incorporated herein by reference in its entirety.

BACKGROUND

Field

Implementations described herein generally relate to the fabrication of integrated circuits and particularly to the deposition of a boron-doped amorphous silicon (a-Si) layers on a semiconductor substrate.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer. Thus, a highly selective etchant enhances accurate pattern transfer.

As the pattern dimensions are reduced, the thickness of the energy sensitive resist is also correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are desirable. As critical dimensions (CD) decrease, current hardmask materials lack the desired etch selectivity relative to underlying materials and are often difficult to deposit.

Therefore, there is a need in the art for an improved hardmask layer and methods for depositing improved hardmask layers.

SUMMARY

Implementations described herein generally relate to the fabrication of integrated circuits and particularly to the deposition of a boron-doped amorphous silicon layers on a semiconductor substrate. In one implementation, a method of forming a boron-doped amorphous silicon layer on a substrate is provided. The method comprises depositing a predetermined thickness of a sacrificial dielectric layer over a substrate, forming patterned features on the substrate by removing portions of the sacrificial dielectric layer to expose an upper surface of the substrate, depositing conformally a predetermined thickness of a boron-doped amorphous silicon layer on the patterned features and the exposed upper surface of the substrate, and selectively removing the boron-doped amorphous silicon layer from an upper surface of the patterned features and the upper surface of the substrate using an anisotropic etching process to provide the patterned features filled within sidewall spacers formed from the boron-doped amorphous silicon layer.

In another implementation, a method of forming a boron-doped amorphous silicon layer on a substrate in a processing chamber is provided. The method comprises depositing conformally a boron-doped amorphous silicon layer on patterned features formed on the substrate, and then selectively removing a boron-doped amorphous silicon layer from an upper surface of the patterned features and an upper surface of the substrate using an anisotropic etching process to provide patterned features filled within sidewall spacers formed from the boron-doped amorphous silicon layer.

In yet another implementation, a method of forming an amorphous silicon layer on a substrate in a processing chamber is provided. The method comprises depositing a predetermined thickness of a sacrificial dielectric layer over a substrate. The method further comprises forming patterned features on the substrate by removing portions of the sacrificial dielectric layer to expose an upper surface of the substrate. The method further comprises depositing conformally a predetermined thickness of a boron-doped amorphous silicon layer on the patterned features and the exposed upper surface of the substrate using a thermal chemical vapor deposition process. The thermal vapor deposition process comprises flowing diborane ($B_2H_6$) or dimethylamine borane [$NH(CH_3)_2BH_3$] (DMAB) into the processing chamber and flowing a silane-containing gas mixture into the processing chamber. The method further comprises selectively removing the boron-doped amorphous silicon layer from an upper surface of the patterned features and the upper surface of the substrate using an anisotropic etching process to provide the patterned features filled within sidewall spacers formed from the boron-doped amorphous silicon layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIGS. 5A-5L are schematic side views of one implementation of a process for using a boron-doped amorphous silicon layer described herein as a hardmask to etch a material layer;

Figure 1:
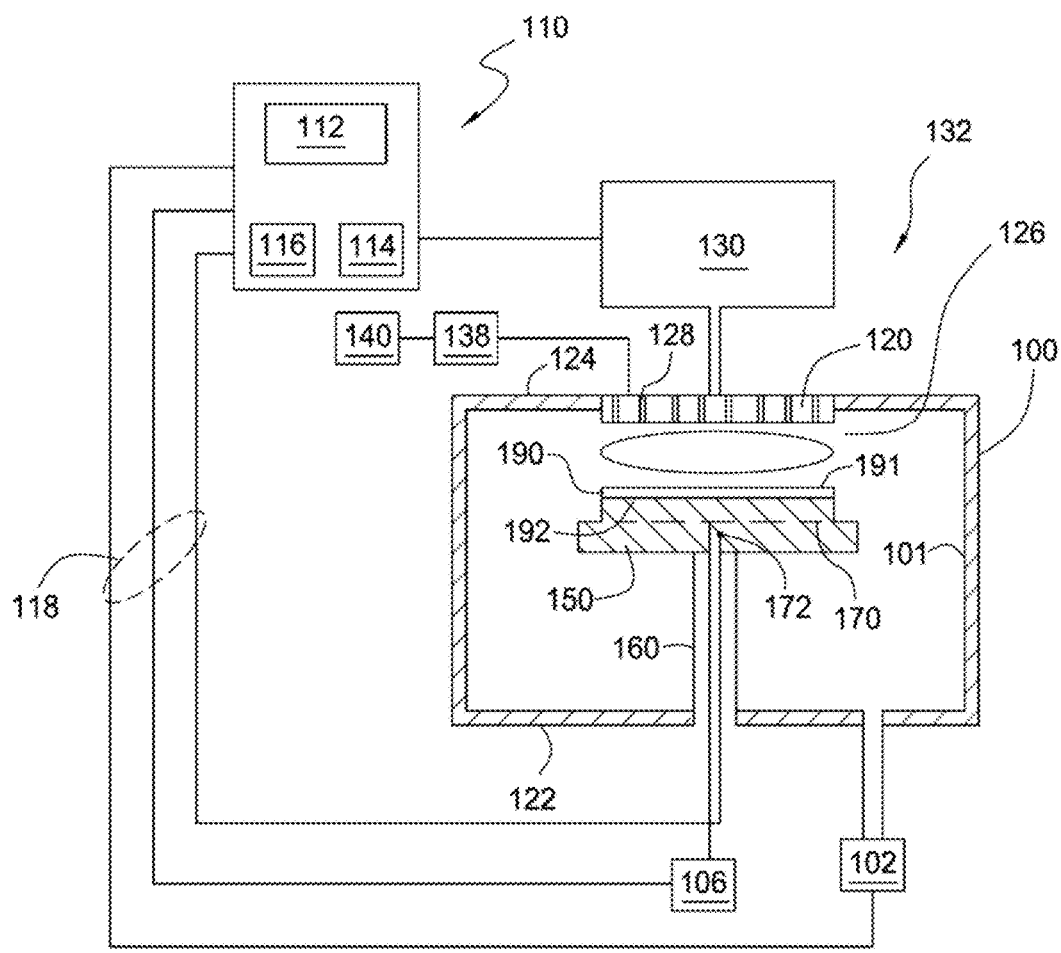
FIG. 1 depicts a schematic illustration of an apparatus that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes films and techniques for deposition of hardmask films and spacer films on a substrate. Certain details are set forth in the following description and in FIGS. 1-7 to provide a thorough understanding of various implementations of the disclosure. Other details describing well-known structures and systems often associated with deposition and etching processes are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a thermal CVD and/or plasma-enhanced chemical vapor deposition (PECVD) process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems and PRODUCER® SE™ systems which are commercially available from Applied Materials, Inc., of Santa Clara, Calif. Other tools capable of performing thermal CVD and PECVD processes may also be adapted to benefit from the implementations described herein. In addition, any system enabling the thermal CVD and/or PECVD processes described herein can be used to advantage. The apparatus description described herein is illustrative and should not be construed or interpreted as limiting the scope of the implementations described herein.

Thermal decomposition of silane and alkylsilane species is a complex reaction in which the gas-phase precursor gives rise to solid phase particles, which deposit on a substrate. Although this area has been investigated for more than fifty years, many challenging problems remain. For example, thermal decomposition of silane at temperatures of 500 degrees Celsius or less is very slow. Although PECVD is the most commonly used method for depositing amorphous Silicon (a-Si) using silane species as precursor, the PECVD a-Si process suffers from poor conformality of the deposited film and the plasma environment damages the underlying film during deposition. The implementations described herein provide a novel method that reduces the dehydrogenation of silane and alkylsilane species to temperatures as low as 80 degrees Celsius by using a borane mediated dehydrogenation process.

In one implementation, a boron-doped a-Si film was deposited by a thermal CVD process. Diborane ($B_2H_6$) or dimethylamine borane [$NH(CH_3)_2BH_3$] (DMAB) was used as a source gas for providing borane in the deposition process. The flow of diborane/DMAB gas mixture ranged from about 1 sccm to 5000 sccm. A carrier gas, for example, argon, helium, or hydrogen gas ($H_2$) was also delivered to the CVD chamber. A silicon-containing source gas mixture, for example, silane, disilane or higher order silanes (e.g., tetrasilane), was used as a precursor for the a-Si deposition. The flow rate of the silicon-containing source gas mixture ranged from 1 sccm to 5000 sccm. The chamber temperature ranged from 80 degrees Celsius to 550 degrees Celsius. Chamber pressure ranged from 100 mTorr to 300 Torr.

FIG. 1 depicts a schematic illustration of a substrate processing system 132 that can be used to perform boron-doped amorphous silicon layer deposition in accordance with implementations described herein. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., Santa Clara, Calif. It is contemplated that other processing system, including those available from other manufacturers, may be adapted to practice the implementations described herein.

The substrate processing system 132 includes a processing chamber 100 coupled to a gas panel 130 and a controller 110. The processing chamber 100 generally includes a top wall 124, a sidewall 101 and a bottom wall 122 that define a processing volume 126. A support pedestal 150 for supporting a substrate is provided in the processing volume 126 of the processing chamber 100. The support pedestal 150 is supported by a stem 160 and may be typically fabricated from aluminum, ceramic, and other suitable materials. The support pedestal 150 may be moved in a vertical direction inside the processing chamber 100 using a displacement mechanism (not shown).

The support pedestal 150 may include a heater element 170 suitable for controlling the temperature of a substrate 190 supported on a surface 192 of the support pedestal 150. The heater element 170 may be embedded in the support pedestal. The support pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thus maintaining the substrate 190 and the support pedestal 150 at a substantially constant temperature during film deposition. The supplied electric current may be adjusted to selectively control the temperature of the support pedestal 150 between about 100 degrees Celsius to about 700 degrees Celsius.

A temperature sensor 172, such as a thermocouple, may be embedded in the support pedestal 150 to monitor the temperature of the support pedestal 150 in a conventional manner. The measured temperature is used by the controller 110 to control the power supplied to the heater element 170 to maintain the substrate at a desired temperature.

A vacuum pump 102 is coupled to a port formed in the bottom of the processing chamber 100. The vacuum pump 102 is used to maintain a desired gas pressure in the processing chamber 100. The vacuum pump 102 also evacuates post-processing gases and by-products of the process from the processing chamber 100.

The substrate processing system 132 may further include additional equipment for controlling the chamber pressure, for example, valves (e.g. throttle valves and isolation valves) positioned between the processing chamber 100 and the vacuum pump 102 to control the chamber pressure.

A showerhead 120 having a plurality of apertures 128 is disposed on the top of the processing chamber 100 above the support pedestal 150. The apertures 128 of the showerhead 120 are utilized to introduce process gases into the processing chamber 100. The apertures 128 may have different sizes, number, distributions, shape, design, and diameters to facilitate the flow of the various process gases for different process requirements. The showerhead 120 is connected to the gas panel 130 that allows various gases to supply to the processing volume 126 during processing. A plasma is formed from the process gas mixture exiting the showerhead 120 to enhance thermal decomposition of the process gases resulting in the deposition of material on a surface 191 of the substrate 190.

The showerhead 120 and support pedestal 150 may form a pair of spaced apart electrodes in the processing volume 126. One or more RF power sources 140 provide a bias potential through a matching network 138 to the showerhead 120 to facilitate generation of plasma between the showerhead 120 and the support pedestal 150. Alternatively, the RF power sources 140 and matching network 138 may be coupled to the showerhead 120, the support pedestal 150, or coupled to both the showerhead 120 and the support pedestal 150, or coupled to an antenna (not shown) disposed exterior to the processing chamber 100. In one implementation, the RF power sources 140 may provide between about 100 Watts and about 3,000 Watts at a frequency of about 50 kHz to about 13.6 MHz. In another implementation, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

The quantity/percentage of boron in the as-deposited boron-doped amorphous silicon film may vary from application to application. In various implementations of the present disclosure, the boron-doped amorphous silicon film may contain at least 1, 5, 8, 10, 15, 20, 25, 30, 35, 40, 45, 50, 55, 60, or 65 atomic percentage of boron. The boron-doped amorphous silicon film may contain up to 5, 8, 10, 15, 20, 25, 30, 35, 40, 45, 50, 55, 60, 65 or 70 atomic percentage of boron. The boron-doped amorphous silicon film may contain from about 1 to about 70 atomic percentage of boron. The boron-doped amorphous silicon film may contain from about 30 to about 60 atomic percentage of boron. The boron-doped amorphous silicon film may contain at least 20, 25, 30, 35, 40, 45, 50, 55, 60, 65, 70, 75, 80, 85, 90, or 95 atomic percentage of silicon. The boron-doped amorphous silicon film may contain up to 25, 30, 35, 40, 45, 50, 55, 60, 65, 70, 75, 80, 85, 90, 95, or 99 atomic percentage of silicon. The boron-doped amorphous silicon film may contain from about 20 to about 99 atomic percentage of silicon, for example about 35 to about 50 atomic percentage of silicon. The boron-doped amorphous silicon film may contain at least 10, 15, 20, 25 atomic percentage of hydrogen. The boron-doped amorphous silicon film may contain up to 15, 20, 25, 30, or 40 atomic percentage of hydrogen. The boron-doped amorphous silicon film may contain from about 10 to about 25 atomic percentage of hydrogen. In certain implementations where nitrogen is used as a precursor, the boron-doped amorphous silicon film may contain at least 5, 10, or 15 atomic percentage of nitrogen. The boron-doped amorphous silicon film may contain up to 10, 15, or 20 atomic percentage of nitrogen. The boron-doped amorphous silicon film may contain from about 5 to about 20 atomic percentage of hydrogen.

In general, the following exemplary deposition process parameters may be used to form the boron-doped amorphous silicon layer. The wafer temperature may range from about 80° C. to about 600° C. (e.g., from about 80° C. to about 100° C.; from about 80° C. to about 200° C. between; from about 450° C. to about 550° C. or from about 450° C. to about 600° C.). The chamber pressure may range from a chamber pressure of about 100 mTorr to about 650 Torr (e.g., about 10 Torr to about 600 Torr; about 100 mTorr to about 300 Torr; between about 2 Torr and about 10 Torr). The flow rate of the silicon-containing gas mixture may be from about 100 sccm to about 5,000 sccm, for example, between about 400 sccm and about 2,000 sccm. The flow rate of a dilution gas may individually range from about 0 sccm to about 20,000 sccm, for example from about 2,000 sccm to about 10,000 sccm. The flow rate of an inert gas may individually range from about 0 sccm to about 20,000 sccm, for example from about 200 sccm to about 2,000 sccm. The flow rate of the boron-containing gas mixture may be from about 1,000 sccm to about 15,000 sccm, for example, between about 5,000 sccm and about 13,000 sccm.

In some implementations where plasma is present, an RF power of between about 1 W/in$^2$ and about 100 W/in$^2$, such as between about 3 W/in$^2$ and about 20 W/in$^2$, and a plate spacing of between about 200 mils to about 600 mils between the top surface of the substrate and the showerhead is used. The boron-doped amorphous silicon layer may be deposited to a thickness between about 5 Å and about 20,000 Å (e.g., between about 300 Å to about 5000 Å; between about 5 Å to about 200 Å). The above process parameters provide a typical deposition rate for the boron-doped amorphous silicon layer in the range of about 100 Å/min to about 10,000 Å/min and can be implemented on a 300 mm substrate in a deposition chamber available from Applied Materials, Inc. of Santa Clara, Calif.

The as-deposited boron-doped amorphous silicon film may have a uniformity (R/2%) of less than 2.0%. The as-deposited boron-doped amorphous silicon film may have a refractive index (RI (633 nm)) of greater than 1.8, for example approximately 3.56. The as-deposited boron-doped amorphous silicon film may have a k-value (K (at 633 nm)) greater than 0.1, for example, approximately 0.36. The as-deposited boron-doped amorphous silicon film may have a stress (MPa) of from about −500 MPa to about 500 MPa, for example −50 MPa. The as-deposited boron-doped amorphous silicon film may have a density (g/cc) of greater than 1.5 g/cc, for example approximately 1.86 g/cc or higher such as 2.2 g/cc.

Figure 2:
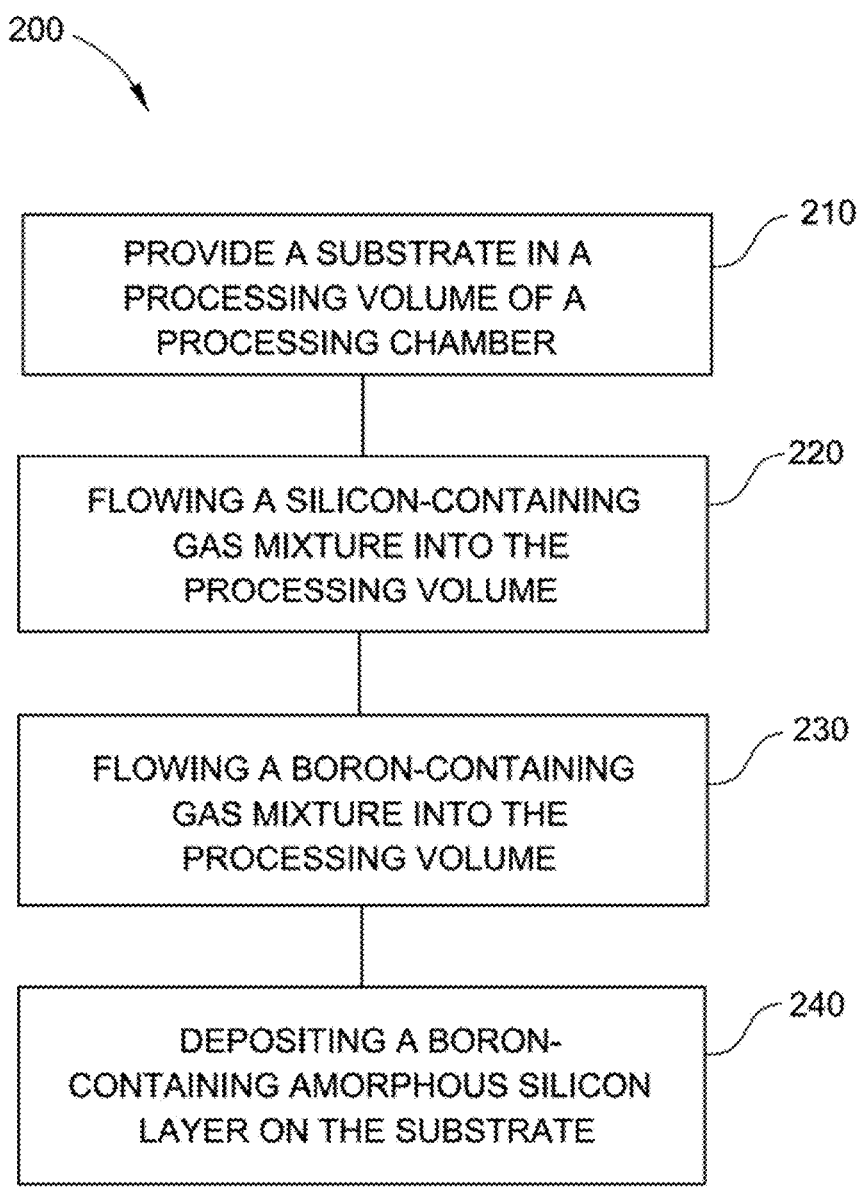
FIG. 2 is a process flow diagram depicting one implementation of a method for depositing a boron-doped amorphous silicon film according to implementations described herein.

FIG. 2 is a process flow diagram depicting one implementation of a method 200 for depositing a boron-doped amorphous silicon film according to implementations described herein. The deposition can occur with or without plasma. The deposition can occur via a thermal CVD process or a PECVD process. The method 200 begins at operation 210 by providing a substrate in a processing volume of a processing chamber. The processing chamber may be the processing chamber 100 depicted in FIG. 1. The substrate may be substrate 190. In one implementation, the surface 191 of the substrate 190 is substantially planar. Alternatively, the substrate 190 may have patterned structures, a surface having trenches, holes, or vias formed therein. The substrate 190 may also have a substantially planar surface having a structure formed thereon or therein at a desired elevation. While the substrate 190 is illustrated as a single body, it is understood that the substrate 190 may contain one or more materials used in forming semiconductor devices such as metal contacts, trench isolations, gates, bitlines, or any other interconnect features. The substrate 190 may comprise one or more metal layers, one or more dielectric materials, semiconductor material, and combinations thereof utilized to fabricate semiconductor devices. For example, the substrate 190 may include an oxide material, a nitride material, a polysilicon material, or the like, depending upon application.

In one implementation where a memory application is desired, the substrate 190 may include the silicon substrate material, an oxide material, and a nitride material, with or without polysilicon sandwiched in between. In another implementation, the substrate 190 may include a plurality of alternating oxide and nitride materials (i.e., oxide-nitride-oxide (ONO)) deposited on a surface of the substrate (not shown). In various implementations, the substrate 190 may include a plurality of alternating oxide and nitride materials, one or more oxide or nitride materials, polysilicon or amorphous silicon materials, oxides alternating with amorphous carbon, oxides alternating with polysilicon, undoped silicon alternating with doped silicon, undoped polysilicon alternating with doped polysilicon, or undoped amorphous silicon alternating with doped amorphous silicon. The substrate may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

At operation 220, a silicon-containing gas mixture is flowed into the processing volume 126. The silicon-containing gas mixture may be flowed from the gas panel 130 into the processing volume 126 through the showerhead 120. The silicon-containing gas mixture may include at least one silicon-containing source gas and optionally an inert gas and/or dilution gas. In one implementation, the silicon-containing source gas mixture is a silane-containing source gas mixture. In one implementation, the silicon-containing source gas is a silane. Examples of suitable silanes include silane ($SiH_4$) and higher-order silanes with the empirical formula $Si_aH_{(2a+2)}$ wherein a=1, 2, 3, 4, . . . , such as disilane ($Si_2H_6$), trisilane ($Si_3H_8$) and tetrasilane ($Si_4H_{10}$), as well as others.

In some implementations, the silicon-containing gas mixture further includes an inert gas or dilution gas. Suitable dilution gases include helium (He), argon (Ar), hydrogen ($H_2$), nitrogen ($N_2$), ammonia ($NH_3$), or combinations thereof, among others. In some implementations, Ar, He, and $N_2$ are used to control the density and deposition rate of the amorphous silicon layer. In some implementations, the addition of $N_2$ and/or $NH_3$ can be used to control the hydrogen ratio of the amorphous silicon layer. Alternatively, dilution gases may not be used during the deposition.

Suitable inert gases, such as argon (Ar) and/or helium (He) may be supplied with the silicon-containing gas mixture into the processing chamber 100. Other inert gases, such as nitrogen ($N_2$) and nitric oxide (NO), may also be used to control the density and deposition rate of the boron-doped amorphous silicon layer. Additionally, a variety of other processing gases may be added to the gas mixture to modify properties of the amorphous silicon material. In one implementation, the processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., silicon to hydrogen ratio) of the deposited amorphous silicon layer. Not to be bound by theory, but it is believed that the hydrogen ratio present in the boron-doped amorphous silicon film provides control over layer properties, such as reflectivity.

At operation 230, a boron-containing gas mixture is flowed into the processing volume 126. The boron-containing gas mixture may be flowed from the gas panel 130 into the processing volume 126 through the showerhead 120. In one implementation, the boron-containing gas mixture is a borane-containing gas mixture. In one implementation, the boron-containing gas mixture comprises a boron-containing compound and optionally a dilution gas and/or an inert gas. Examples of suitable boron-containing compounds include diborane ($B_2H_6$), dimethylamine borane (DMAB or [NH($CH_3$)$_2$BH$_3$]), trimethylborane (TMB or B($CH_3$)$_3$), triethylborane (TEB), combinations thereof and similar compounds.

In one implementation, the percentage of boron-containing compound in the total boron-containing gas mixture is from about 2% to about 20%. In another implementation, the percentage of boron-containing compound in the total boron-containing gas mixture is from about 5% to about 10%. Exemplary boron-containing gas mixtures may include 5% $B_2H_6$/95% $N_2$, 5% $B_2H_6$/95% He, 10% $B_2H_6$/90% He, 5% $B_2H_6$/95% Ar, 10% $B_2H_6$/90% Ar, or 5% $B_2H_6$/95% $H_2$. It is contemplated that when different concentrations of boron-containing gas mixtures are used, the flow rate required to achieve certain film properties may change accordingly. For example in case where 5% diborane is used as the boron-containing gas source, the flow rate of the boron-containing gas mixture may be from about 20 sccm to about 5000 sccm, for example, about 200 sccm. In one another example where 10% diborane is used as the boron-containing gas source, the flow rate of the boron-containing gas mixture may be from about 10 sccm to about 3000 sccm, for example about 100 sccm to about 2000 sccm.

At operation 240, the boron-doped amorphous silicon layer is deposited on the substrate 190. The deposition can occur either in the presence of plasma or without plasma. In some implementations where plasma is used, an RF plasma is generated in the processing volume 126 to deposit a boron-doped amorphous silicon film on the substrate 190. FIG. 2 herein shows one implementation where the silicon-containing gas mixture and the boron-containing gas mixture are introduced into the processing volume 126 before turning on the RF plasma. In some implementation, a plasma-initiating gas (e.g., helium and/or argon) is also introduced into the processing volume 126. In such a case, the silicon-containing gas mixture may be introduced into the processing volume 126 for a longer time such as between about 5 seconds and about 30 seconds, for example about 15 seconds, which may vary depending upon the size of the substrate. The flowing of the silicon-containing gas mixture prior to the introduction of the boron-containing gas is believed to provide continuous thermal and pressure stabilization of the processing volume 126. While flowing the silicon-containing gas mixture, the boron-containing gas mixture is then flowing into the processing volume 126 about 0.5 seconds to about 5 seconds, for example about 1 seconds to about 2 seconds (the flowing time may vary as long as the flow is just long enough for the boron-containing gas mixture to start reaching the processing volume 126) prior to striking the RF plasma. The silicon-containing gas mixture and the boron-containing gas mixture may continue flow until a desired thickness of the boron-doped amorphous silicon film is reached. Alternatively, the RF plasma may be generated prior to introduction of the silicon-containing gas mixture and/or the boron-containing gas mixture into the processing volume 126.

In implementations without plasma, the silicon-containing gas mixture and the boron-containing gas mixture are typically heated to deposit the boron-doped amorphous silicon layer on the substrate 190.

The thickness of the boron-doped amorphous silicon film is variable depending upon the stage of processing. In one implementation for spacer applications, the boron-doped amorphous silicon film may have a thickness from about 20 Å and about 500 Å (e.g., from about 20 Å to about 100 Å; from about 30 Å to about 50 Å). In another implementation, for hardmask applications, the boron-doped amorphous silicon film may have a thickness from about 100 Å and about 50,000 Å (e.g., from about 300 Å to about 5000 Å; from about 1000 Å to about 2000 Å). The boron-doped amorphous silicon film may be patterned using a standard photoresist patterning techniques. The boron-doped amorphous silicon film may be removed using a solution comprising, for example, tetramethylammonium hydroxide. The boron-doped amorphous silicon film may also be removed using etch chemistries containing oxygen and halogens (e.g. fluorine or chlorine), for example, $Cl_2/O_2$, $CF_4/O_2$, $Cl_2/O_2/CF_4$.

Figure 3:
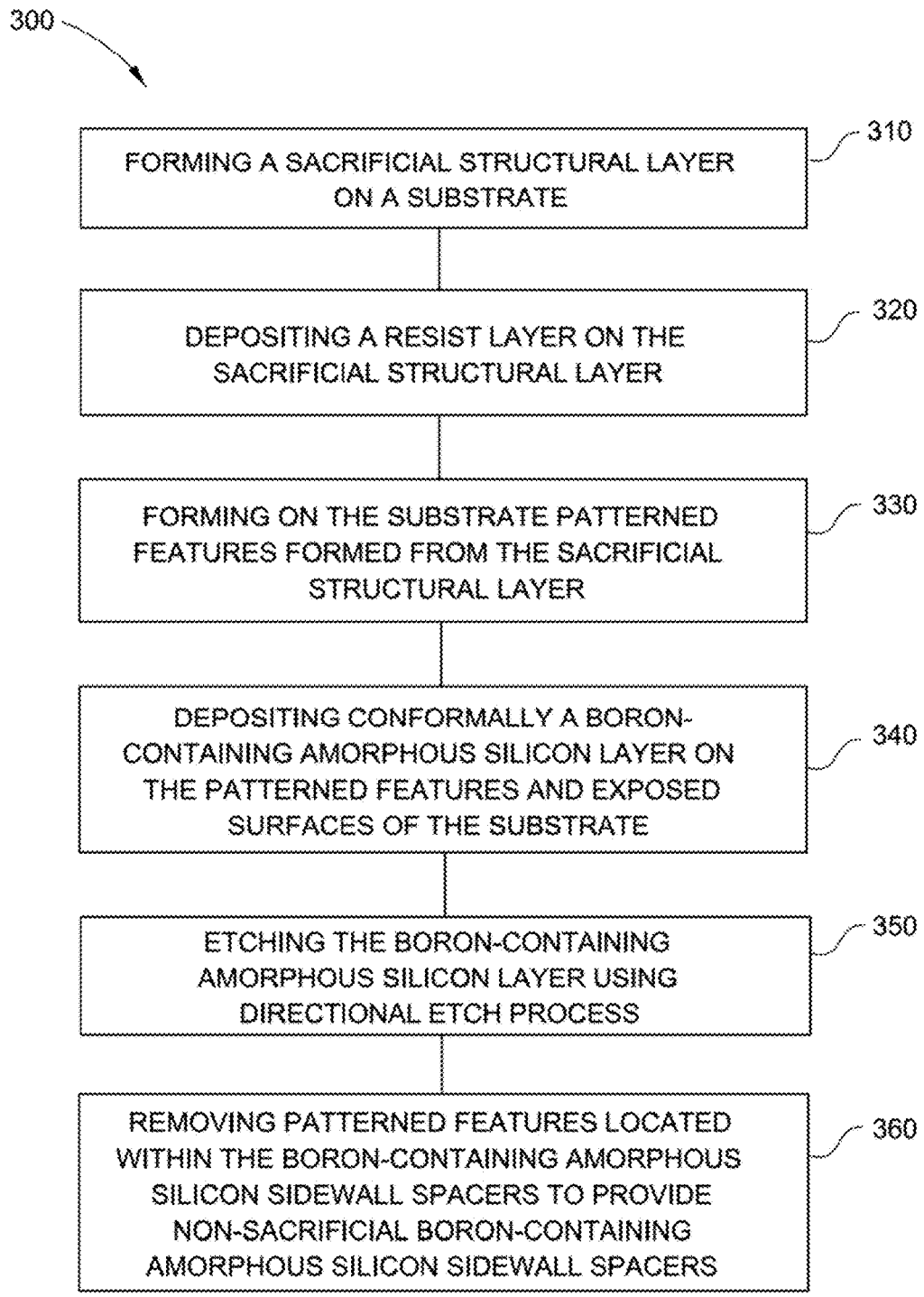
FIG. 3 is a process flow diagram depicting one implementation of a method for using a boron-doped amorphous silicon film described herein as a spacer mask in a patterning process according to implementations described herein.

FIG. 3 is a process flow diagram depicting one implementation of a method for using a boron-doped amorphous silicon film described herein as a spacer mask in a patterning process according to implementations described herein.

FIGS. 4A-4E are schematic side views of a structure formed according to the process of FIG. 3. It is contemplated that the self-aligned double patterning process is chosen for illustration purpose. The concepts described herein are equally applicable to other processes, for example, single or dual patterning scheme, such as via/hole shrink process, self-aligned triple patterning (SATP) process, or self-aligned quadruple patterning (SAQP) process, etc. that may involve the use of protective spacers with variable line width and spacing or protective sacrificial layer as needed in various semiconductor processes such as NAND flash application, DRAM application, or CMOS application, etc.

The method 300 starts at operation 310 by forming a sacrificial structural layer 420 on a substrate 400. The substrate may be similar to substrate 190. The sacrificial structural layer 420 may be a silicon-based material such as silicon oxide, silicon nitride, or polysilicon. Alternatively, the sacrificial structural layer 420 may be a carbon-based material such as amorphous carbon. In cases where a carbon-based sacrificial structural layer is desired, the sacrificial structural layer 420 may be a combination of amorphous carbon and hydrogen (hydrogenated amorphous carbon film). One exemplary amorphous carbon film may be a strippable Advanced Patterning Film™ (APF) material commercially available from Applied Materials, Inc. of Santa Clara, Calif. It is contemplated that the choice of materials used for the sacrificial structural layer 420 may vary depending upon the etching/ashing rate relative to the conformal protective layer to be formed thereon. While not shown, in certain implementations where a carbon-based sacrificial structural layer is used, one or more anti-reflective coating layers may be deposited on the carbon-based sacrificial structural layer to control the reflection of light during a lithographic patterning process. Suitable anti-reflective coating layer may include silicon dioxide, silicon oxynitride, silicon nitride, or combinations thereof. One exemplary anti-reflective coating layer may be a DARC™ material commercially available from Applied Materials, Inc. of Santa Clara, Calif.

The substrate 400 may have a substantially planar surface 423 as shown. Alternatively, the substrate 400 may have patterned structures, a surface having trenches, holes, or vias formed therein. While the substrate 400 is illustrated as a single body, the substrate 400 may contain one or more materials used in forming semiconductor devices such as metal contacts, trench isolations, gates, bitlines, or any other interconnect features. In one implementation, the substrate 400 may include one or more metal layers, one or more dielectric materials, semiconductor material, and combinations thereof utilized to fabricate semiconductor devices. For example, the substrate 400 may include an oxide material, a nitride material, a polysilicon material, or the like, depending upon application. In cases where a memory application is desired, the substrate 400 may include the silicon substrate material, an oxide material, and a nitride material, with or without polysilicon sandwiched in between.

Figure 4A:
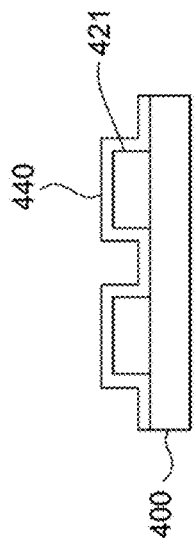
FIGS. 4A-4E are schematic side views of a structure formed according to the process flow diagram of FIG. 3.

At operation 320, a resist layer 430, such as a photoresist material, is deposited on the sacrificial structural layer 420 as shown in FIG. 4A.

Figure 4B:
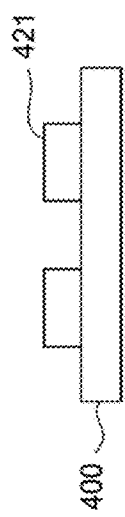

At operation 330, patterned features 421 formed from the sacrificial structural layer 420 are produced on the substrate 400 using standard photolithography and etching techniques, as shown in FIG. 4B. The patterned features may be formed from any suitable material, for example oxides, such as silicon dioxide, silicon oxynitride, or nitrides such as silicon nitride. The patterned features are sometimes referred to as placeholders, mandrels or cores and have specific linewidths and/or spacings based upon the photoresist material used. The width of the patterned features 421 may be adjusted by subjecting the resist layer 430 to a trimming process. After the pattern has been transferred into the sacrificial structural layer 420, any residual photoresist and hardmask material (if used) are removed using a suitable photoresist stripping process.

Figure 4C:
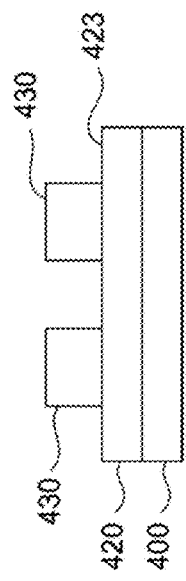

At operation 340, a boron-doped amorphous silicon protective layer 440 is deposited conformally or substantially conformally on the patterned features 421 and the exposed surfaces of the substrate 400, as shown in FIG. 4C. The boron-doped amorphous silicon protective layer 440 is formed according to the implementations described herein. The thickness of the boron-doped amorphous silicon protective layer 440 may be between about 5 Å and about 200 Å.

Figure 4D:
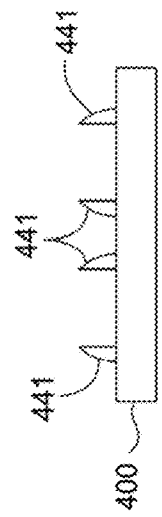

At operation 350, after the boron-doped amorphous silicon protective layer 440 has been deposited conformally on the patterned features 421, the boron-doped amorphous silicon protective layer 440 is anisotropically etched (a vertical etch) to expose an upper surface of the substrate 400 in areas 411 and expose an upper surface of the patterned features 421, resulting in the patterned features 421 (formed from the sacrificial structural layer 420) protected by boron-doped amorphous silicon-based sidewall spacers 441, as shown in FIG. 4D.

Figure 4E:
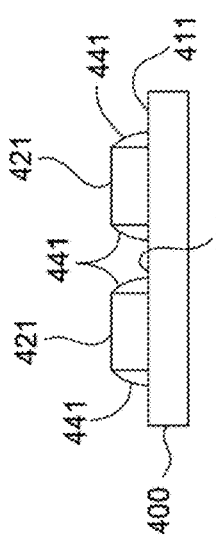

At operation 360, the patterned features 421 (formed from the sacrificial structural layer 420) are removed using a conventional plasma etching process or other suitable wet stripping process, leaving non-sacrificial boron-doped amorphous silicon-based sidewall spacers 441 as shown in FIG. 4E. The plasma etching process may be done by introducing a fluorine-based etching chemistry into a plasma above the substrate. Due to the improved material quality and coverage, the boron-doped amorphous silicon-based sidewall spacers 441 are not damaged because they have very good selectivity to the fluorine-based reactive etching chemistry or the wet strip-based chemistry. Upon removal of the patterned features 421, the remaining boron-doped amorphous silicon-based sidewall spacers 441 may be used as a hardmask for etching the underlying layer, layer stack, or structure. Particularly, the density of the boron-doped amorphous silicon-based sidewall spacers 441 in accordance with this patterning process is twice that of the photo-lithographically patterned features 421, the pitch of the boron-doped amorphous silicon-based sidewall spacers 441 is half the pitch of the patterned features 421. The boron-doped amorphous silicon-based sidewall spacers 441 maybe used as a hardmask to pattern underlying material layers.

FIGS. 5A-5I are schematic side views of a process for using a boron-doped amorphous silicon layer as described herein to etch a material layer. A base material 510 is deposited on a substrate surface (not shown) to begin forming a material stack 500. The substrate may be similar to substrate 190. The base material may be one or more materials used in forming semiconductor devices including a silicon substrate material, an oxide material, a polysilicon material, or the like. A first boron-doped amorphous silicon layer 520 is deposited on the base material 510 and a first anti-reflective coating material 530 is deposited on the first boron-doped amorphous silicon layer 520 as shown in FIG. 5B. The first boron-doped amorphous silicon layer may be deposited by any of the processes described herein. The first anti-reflective coating material 530 is used to control the reflection of light during a lithographic patterning process. The first anti-reflective coating material 530 may comprise silicon dioxide, silicon oxynitride, silicon nitride, or combinations thereof. The anti-reflective coating material may be a DARC™ material layer commercially available from Applied Materials, Inc. of Santa Clara, Calif.

A second boron-doped amorphous silicon layer 540 and a second antireflective coating material 550 may be deposited sequentially on the first antireflective coating material as shown in FIG. 5C. The second boron-doped amorphous silicon layer may be deposited by any of the processes described herein. The second boron-doped amorphous silicon layer 540 and second antireflective coating material 550 may be the same materials as deposited for the first boron-doped amorphous silicon layer 520 and first anti-reflective coating material 530. A resist layer 560, such as a photoresist material, is then deposited on the second antireflective coating material 550 as shown in FIG. 5D. The resist layer is then patterned by a lithographic process producing a patterned resist layer 561 as shown in FIG. 5E. The first pattern 562 formed in the patterned resist layer 561 is transferred to the second boron-doped amorphous silicon layer 540 to form a patterned second boron-doped amorphous silicon layer 541 by first etching the second antireflective coating material 550 and then the second boron-doped amorphous silicon layer 540 by one or more etching processes as shown in FIG. 5F. The patterned second boron-doped amorphous silicon layer 541 may perform as a hardmask for the underlying material. The second antireflective coating material 550 may be removed by the one or more etching processes or by a separate process.

A third boron-doped amorphous silicon layer 570 is deposited on the first anti-reflective coating material 530 and the patterned second boron-doped amorphous silicon layer 541 as shown in FIG. 5G. The third boron-doped amorphous silicon layer may be deposited by any of the processes described herein. The third boron-doped amorphous silicon layer 570 is patterned by an anisotropic etch process to provide for sidewall boron-doped amorphous silicon materials 571 as shown in FIG. 5H. The presence of the sidewall boron-doped amorphous silicon materials 571 allows for the formation of a second pattern 572 with reduced critical dimensions and feature sizes, i.e., increased pattern density, than can otherwise normally be achieved through current photolithographic processes. The patterned second boron-doped amorphous silicon layer 541 in combination with the sidewall boron-doped amorphous silicon materials 571 may perform as a hardmask layer for the underlying first anti-reflective coating material 530 and the first boron-doped amorphous silicon layer 520.

The first anti-reflective coating material 530 is then etched to form a patterned antireflective coating layer 531 with the second pattern 572 as shown in FIG. 5I. The patterned second boron-doped amorphous silicon layer 541 and the sidewall boron-doped amorphous silicon materials 571 are removed during the etching process or by a subsequent process. The first boron-doped amorphous silicon layer 520 is then etched to form a patterned first boron-doped amorphous silicon layer 521 having the second pattern 572 to be transferred to the underlying base material 510. The base material 510 is then etched using the patterned first boron-doped amorphous silicon layer 521 as a hardmask layer as shown in FIG. 5K and the patterned first boron-doped amorphous silicon layer 521 is removed to provide a substrate surface with a patterned base material 511 having the second pattern 572 as shown in FIG. 5L.

In an alternative implementation, a patterned resist material is used in place of the patterned second boron-doped amorphous silicon layer 541 for FIGS. 5F-5L, thus eliminating the need for the patterned second boron-doped amorphous silicon layer 540 and a second antireflective coating material 550 and the corresponding deposition processes and etching processes of FIGS. 5C-5E. In certain implementations, any of the boron-doped amorphous silicon layers may be replaced with an amorphous carbon layer, such as an Advanced Patterning Film™ (APF) material commercially available from Applied Materials, Inc. of Santa Clara, Calif.

Figure 6:
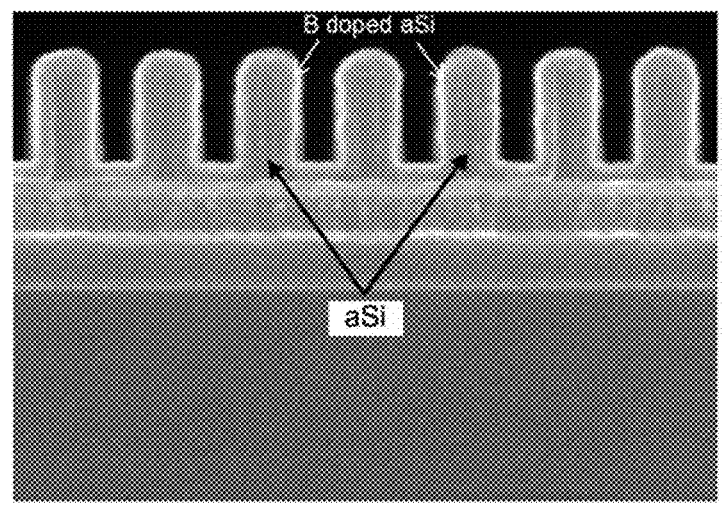
FIG. 6 is SEM image depicting a conformal boron-doped amorphous silicon film formed on a silicon mandrel according to implementations described herein.

FIG. 6 is SEM image depicting a conformal boron-doped amorphous silicon film formed on a silicon mandrel according to implementations described herein. At certain deposition conditions with a 500 sccm flow of disilane, the deposition rate of the boron-doped amorphous silicon film was about 20 Å/minute. By co-flowing of DMAB into the CVD chamber and keeping the other parameters the same, the film deposition rate increased to about 7000 Å/minute. A 350-time enhancement of deposition rate was observed, indicating that borane lowers the reaction barrier and increases the deposition rate. As shown in FIG. 6, a conformal boron-doped amorphous silicon layer was deposited on a silicon mandrel at 200 degrees Celsius. This demonstrates that borane reduces the energy barrier of silane decomposition, lowers the deposition temperature, and enhances the deposition rate of the decomposition reaction of silane, alkylsilanes, and their species. Boron-doped amorphous-silicon also demonstrates a conformality greater than 90% and a pattern loading of less than 10% as shown in FIG. 6.

Figure 7:
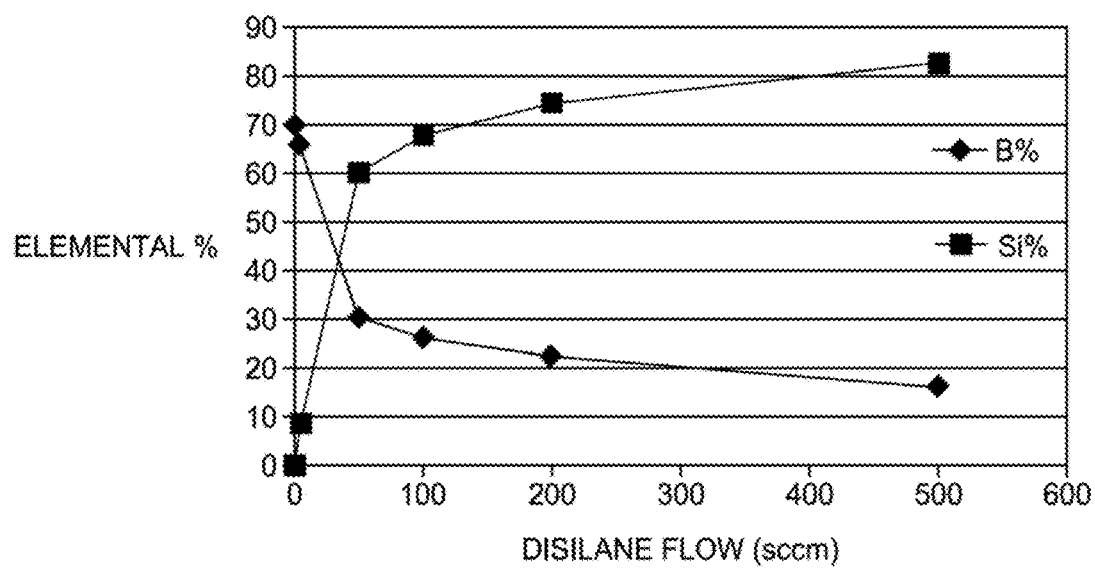
FIG. 7 is a plot depicting boron elemental concentration at different disilane flow rates.

FIG. 7 is a plot depicting elemental concentration of boron at different disilane flow rates. As shown in FIG. 7, the boron-concentration in boron-doped amorphous-silicon can be tuned by tuning the boron precursor/silicon precursor flow ratio. Multiple patterning is a technique that overcomes the lithographic limitations in the chip-manufacturing process. Other than conformality and pattern loading, it is also valuable to develop spacer materials, which have etch selectivity/removalbility over current spacer, mandrel and substrate materials. In order to solve the problem, new spacer materials are needed to differentiate from current spacer materials (such as SiN and TiO), or substrate materials (such as SiO), or mandrel materials (such as amorphous carbon). On the other hand, boron doped amorphous silicon can be used as a hard mask for reactive ion etching (RIE) processes due to strong Si—B and B—B bonds. With 37% boron dopant, boron-doped amorphous silicon shows a 20% improvement of etch selectivity during oxide dielectric etch process. Other than excellent etch selectivity, boron-doped amorphous-silicon has many unique characteristics as a hard mask, such as high deposition rate, greater than 10 kÅ/minute and small film stress, for example, less than 200 MPa.

In summary, borane can greatly reduce the energy barrier during the decomposition of silane and alkylsilane species. Due to excellent conformality and pattern loading, tunable boron percentage, robust etch resistance, boron-doped amorphous-silicon is a good candidate for spacer applications. In addition, due to fast deposition rates, small film stress, and good etch selectivity, boron-doped amorphous silicon is also a good candidate for hard mask applications.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A method of forming an amorphous silicon layer on a substrate in a processing chamber, comprising:
depositing a predetermined thickness of a sacrificial dielectric layer over a substrate;
forming patterned features on the substrate by removing portions of the sacrificial dielectric layer to expose an upper surface of the substrate;
depositing conformally a predetermined thickness of a boron-doped amorphous silicon layer on the patterned features and the exposed upper surface of the substrate, comprising:
flowing dimethylamine borane [NH(CH$_3$)$_2$BH$_3$] (DMAB) into the processing chamber; and
flowing a silane-containing gas mixture into the processing chamber; and
selectively removing the boron-doped amorphous silicon layer from an upper surface of the patterned features and the upper surface of the substrate using an anisotropic etching process to provide the patterned features filled within sidewall spacers formed from the boron-doped amorphous silicon layer, wherein the sacrificial dielectric layer comprises silicon nitride, polysilicon, or amorphous carbon.

2. The method of claim 1, further comprising removing the patterned features from the substrate.

3. The method of claim 1, wherein the silane-containing gas mixture comprises one or more silane-containing compounds selected from silane (SiH$_4$), disilane (Si$_2$H$_6$), trisilane (Si$_3$H$_8$), tetrasilane (Si$_4$H$_{10}$), and combinations thereof.

4. The method of claim 1, wherein depositing the boron-doped amorphous silicon layer on the patterned features is performed using a thermal chemical vapor deposition process.

5. The method of claim 1, wherein depositing the boron-doped amorphous silicon layer on the patterned features is performed using a plasma-enhanced chemical vapor deposition (PECVD) process.

6. The method of claim 5, further comprising introducing a plasma-initiating gas into the processing chamber.

7. The method of claim 1, wherein the sacrificial dielectric layer comprises amorphous carbon.

8. The method of claim 1, wherein the substrate comprises a plurality of alternating oxide and nitride materials, one or more oxide materials or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon.

9. The method of claim 1, wherein the boron-doped amorphous silicon layer has a thickness from about 5 Å to about 200 Å.

10. A method of forming a boron-doped amorphous silicon layer on a substrate in a processing chamber, comprising:
depositing conformally a boron-doped amorphous silicon layer on patterned features formed on the substrate, comprising:
flowing dimethylamine borane [NH(CH$_3$)$_2$BH$_3$] (DMAB) into the processing chamber; and
flowing a silane-containing gas mixture into the processing chamber; and selectively removing a boron-doped amorphous silicon layer from an upper surface of the patterned features and an upper surface of the substrate using an anisotropic etching process to provide patterned features filled within sidewall spacers formed from the boron-doped amorphous silicon layer, wherein the patterned features comprise silicon nitride, polysilicon, or amorphous carbon.

11. The method of claim 10, further comprising removing the patterned features from the substrate.

12. The method of claim 10, wherein the silane-containing gas mixture comprises one or more silane-containing compounds selected from silane ($SiH_4$), disilane ($Si_2H_6$), trisilane ($Si_3H_8$), tetrasilane ($Si_4H_{10}$), and combinations thereof.

13. The method of claim 10, wherein depositing the boron-doped amorphous silicon layer on the patterned features is performed using a thermal chemical vapor deposition process.

14. The method of claim 10, wherein depositing conformally the boron-doped amorphous silicon layer on the patterned features is performed using a plasma-enhanced chemical vapor deposition (PECVD) process.

15. The method of claim 10, wherein the patterned features comprise amorphous carbon.

16. A method of forming an amorphous silicon layer on a substrate in a processing chamber, comprising:
  depositing a predetermined thickness of a sacrificial dielectric layer over a substrate;
  forming patterned features on the substrate by removing portions of the sacrificial dielectric layer to expose an upper surface of the substrate;
  depositing conformally a predetermined thickness of a boron-doped amorphous silicon layer on the patterned features and the exposed upper surface of the substrate using a thermal chemical vapor deposition process, comprising:
    flowing dimethylamine borane [$NH(CH_3)_2BH_3$] (DMAB) into the processing chamber; and
    flowing a silane-containing gas mixture into the processing chamber; and
  selectively removing the boron-doped amorphous silicon layer from an upper surface of the patterned features and the upper surface of the substrate using an anisotropic etching process to provide the patterned features filled within sidewall spacers formed from the boron-doped amorphous silicon layer, wherein the sacrificial dielectric layer comprises silicon nitride, polysilicon, or amorphous carbon.

* * * * *